United States Patent [19]

Kawashima et al.

[11] 4,264,880
[45] Apr. 28, 1981

[54] SIGNAL GENERATOR FOR PRODUCING PULSE SIGNALS FOR A REMOTE CONTROL

[75] Inventors: Kazumi Kawashima; Yoshikazu Tsuboi, both of Takatsuki, Japan

[73] Assignee: Matsushita Electric Industrial Co., Ltd., Kadoma, Japan

[21] Appl. No.: 964,522

[22] Filed: Nov. 29, 1978

[30] Foreign Application Priority Data

Dec. 2, 1977 [JP] Japan .................... 52-145241

[51] Int. Cl.³ .................................................. H03K 7/08
[52] U.S. Cl. .................................... 332/9 R; 328/37; 375/22; 340/167 A
[58] Field of Search ............ 332/9 R; 325/38 R, 142; 328/37; 340/168 S, 167 A, 168 B, 349; 375/22, 35; 307/221 R

[56] References Cited

PUBLICATIONS

E. W. Rosen and D. Styczinski, "Clocked and Binary Pulse–Width Modulator–Demodulator," IBM Technical Disclosure Bulletin, vol. 16, No. 8, Jan. 1974, 325-142.

Primary Examiner—Siegfried H. Grimm
Assistant Examiner—Edward P. Westin
Attorney, Agent, or Firm—Cushman, Darby & Cushman

[57] ABSTRACT

A signal generator for producing a pulse width modulated signal for highly reliable remote controlling. Binary signals ($2^0$ to $2^3$) are coupled into respective input terminals of a shift register (8) having a predetermined number of flip-flop stages (FF 21-FF 24), producing a serial output pulse train having a specified number of pulses comprising broader pulses and narrower pulses. The output pulse train from the output terminal (Q24) of the last stage (FF 24) is coupled to an output pulse generating circuit (11) for pulse width modulation, and an inverted output from the other output terminal (Q̄24) is coupled into the first stage input terminal (D21) of the shift register (8), thereby producing a pulse train consisting of a combination of a first part and a second part, the second part having an opposite relation between its broader pulses and narrower pulses to that of the first part. Thus, the time interval for the total pulse train consisting of the first part and the second part is constant regardless of the contents of the input binary signal.

3 Claims, 20 Drawing Figures

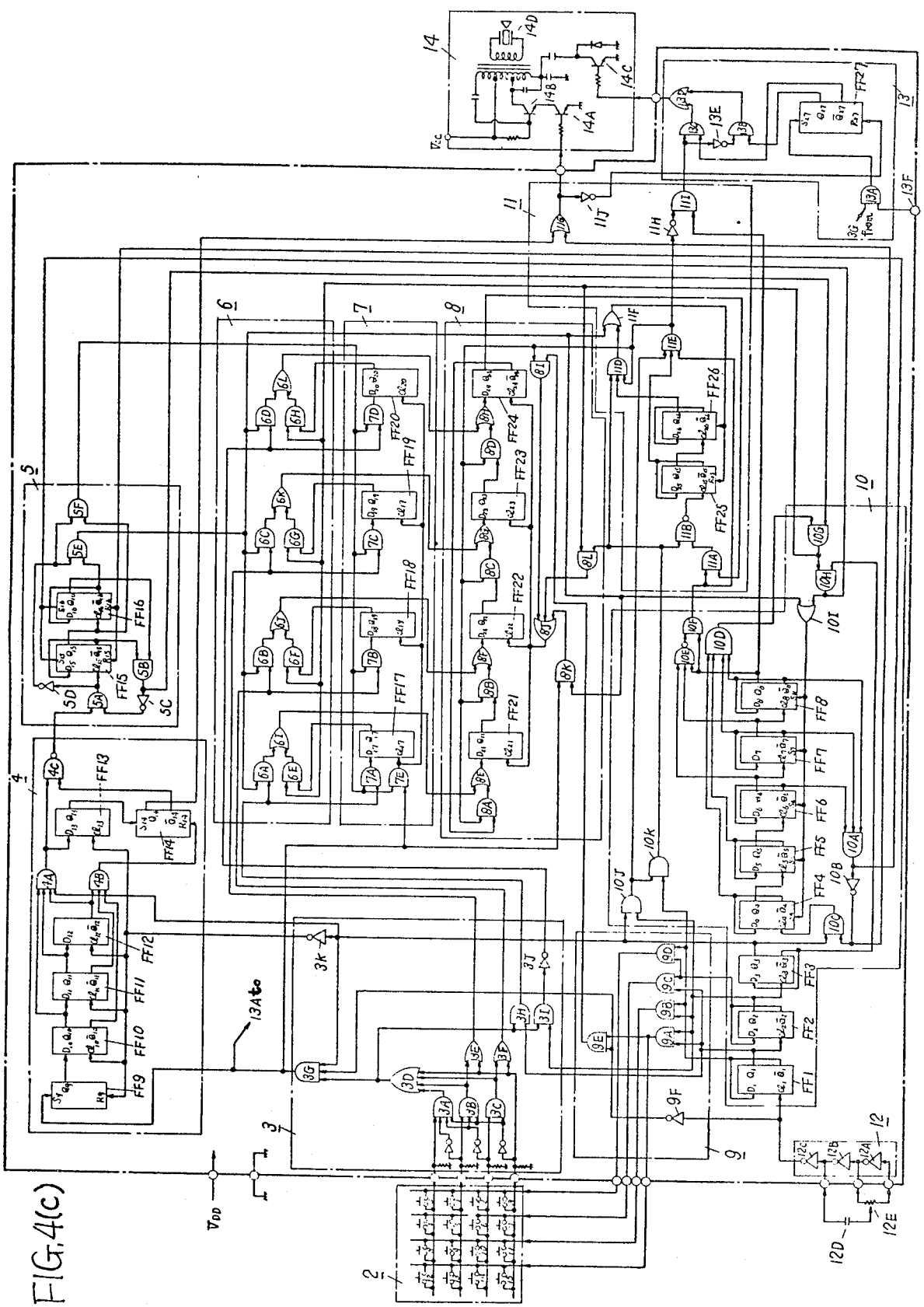

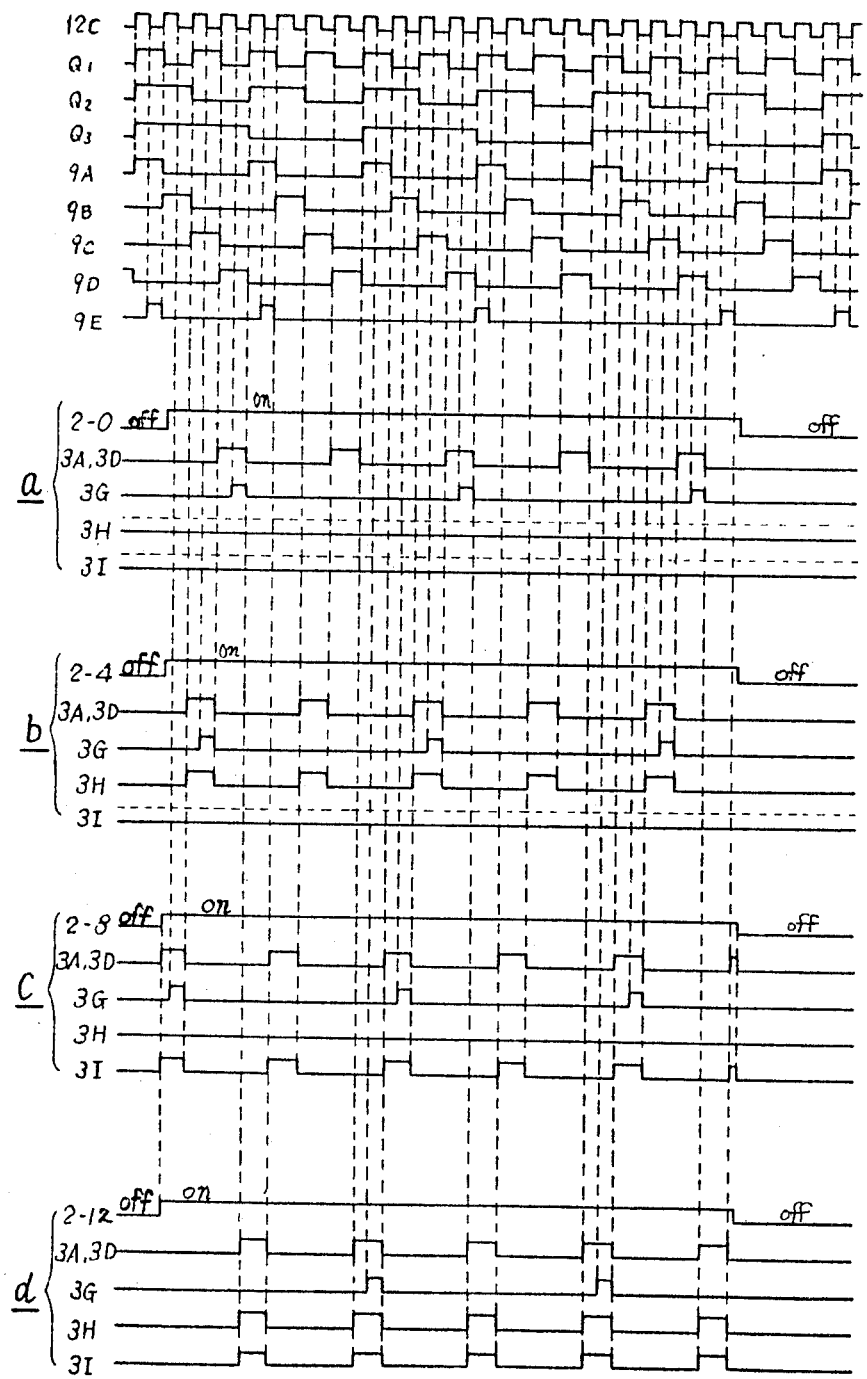

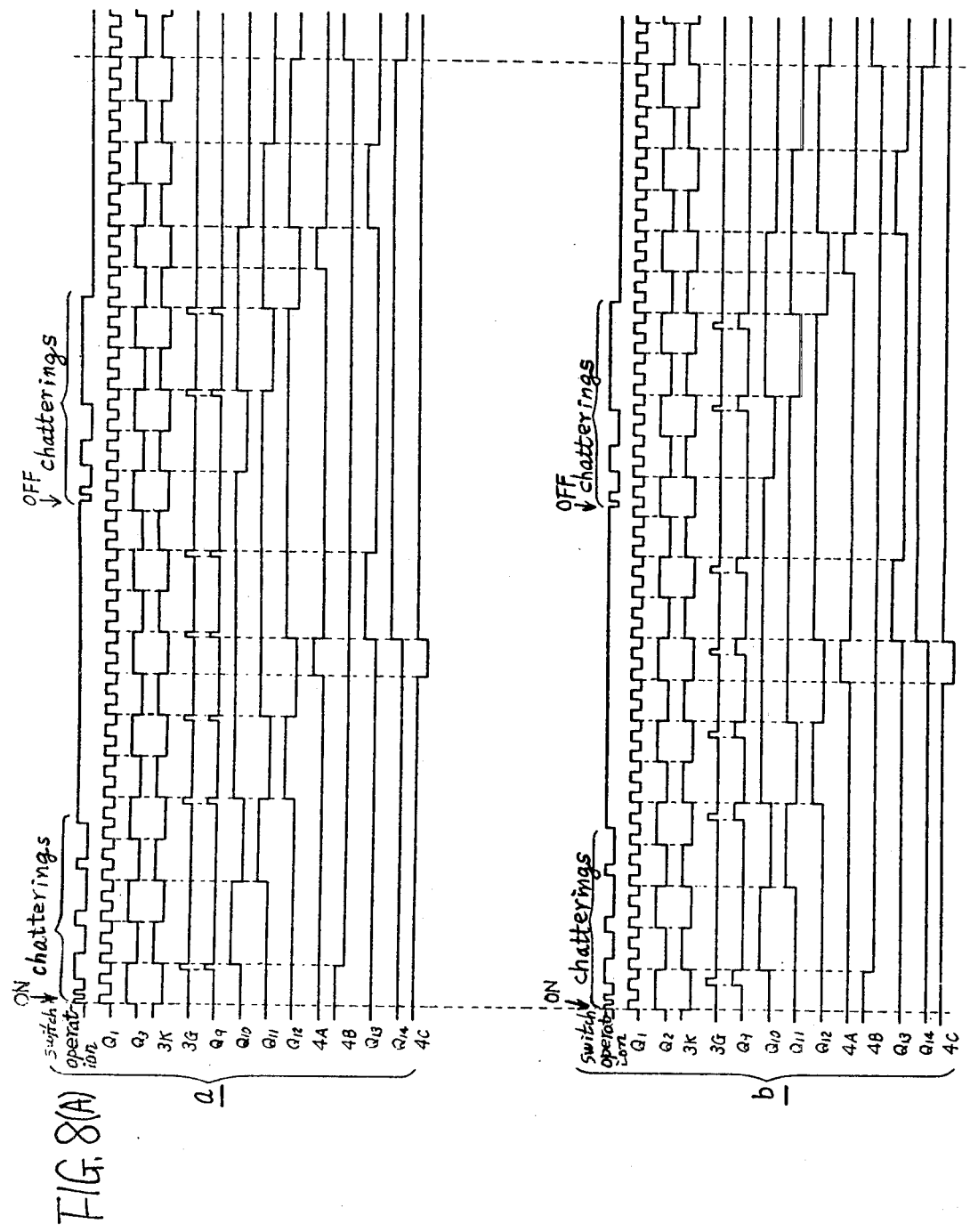

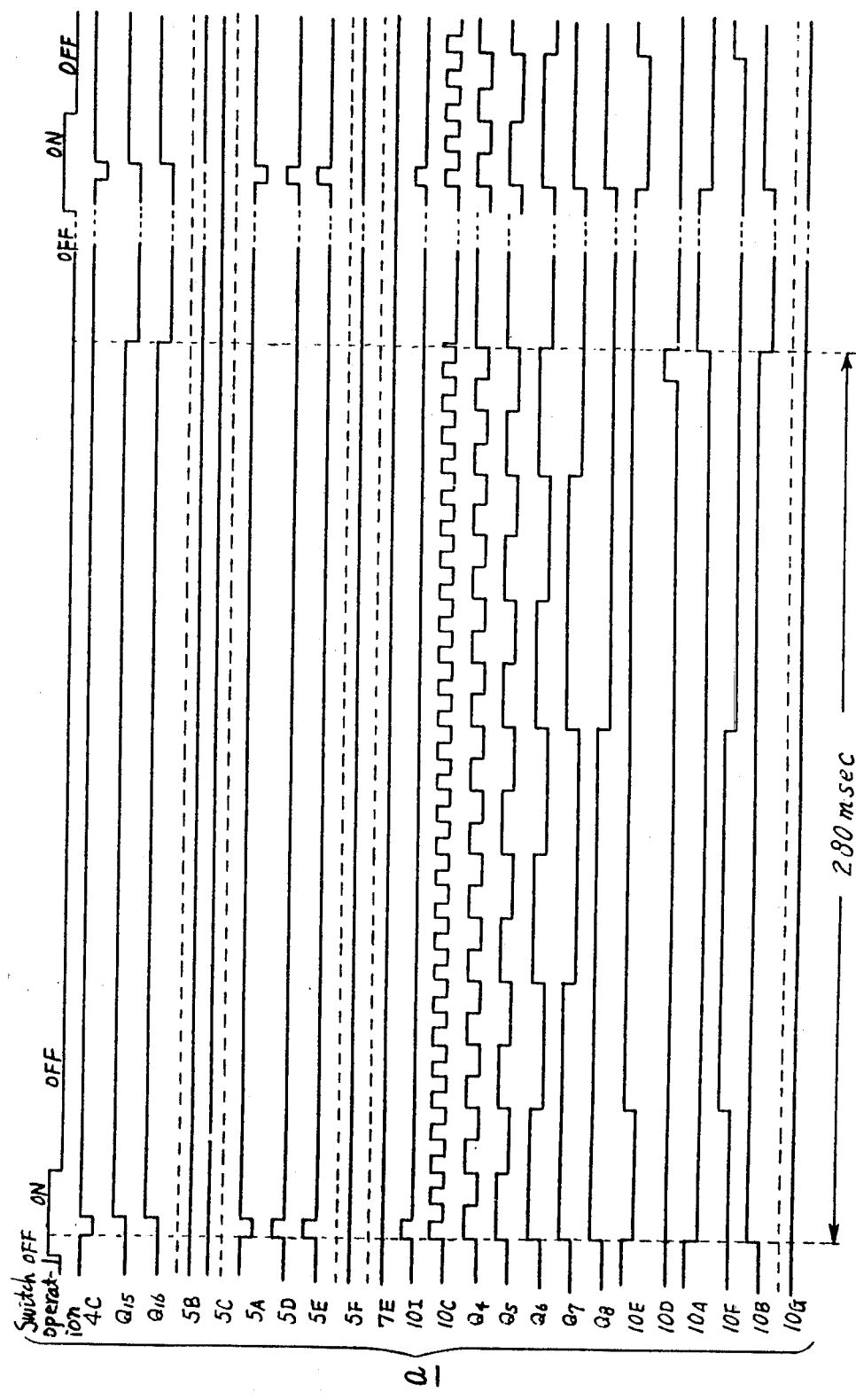

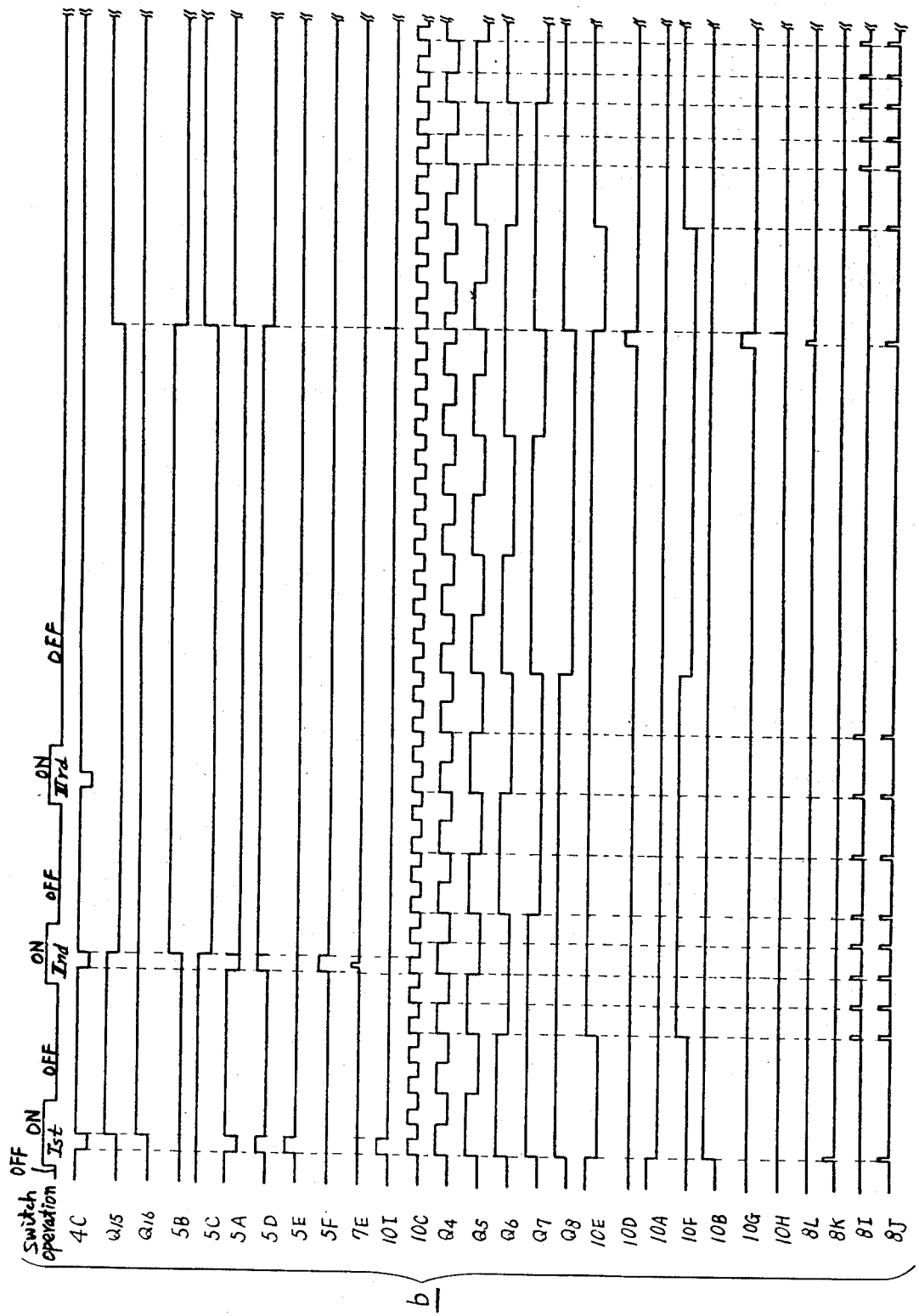

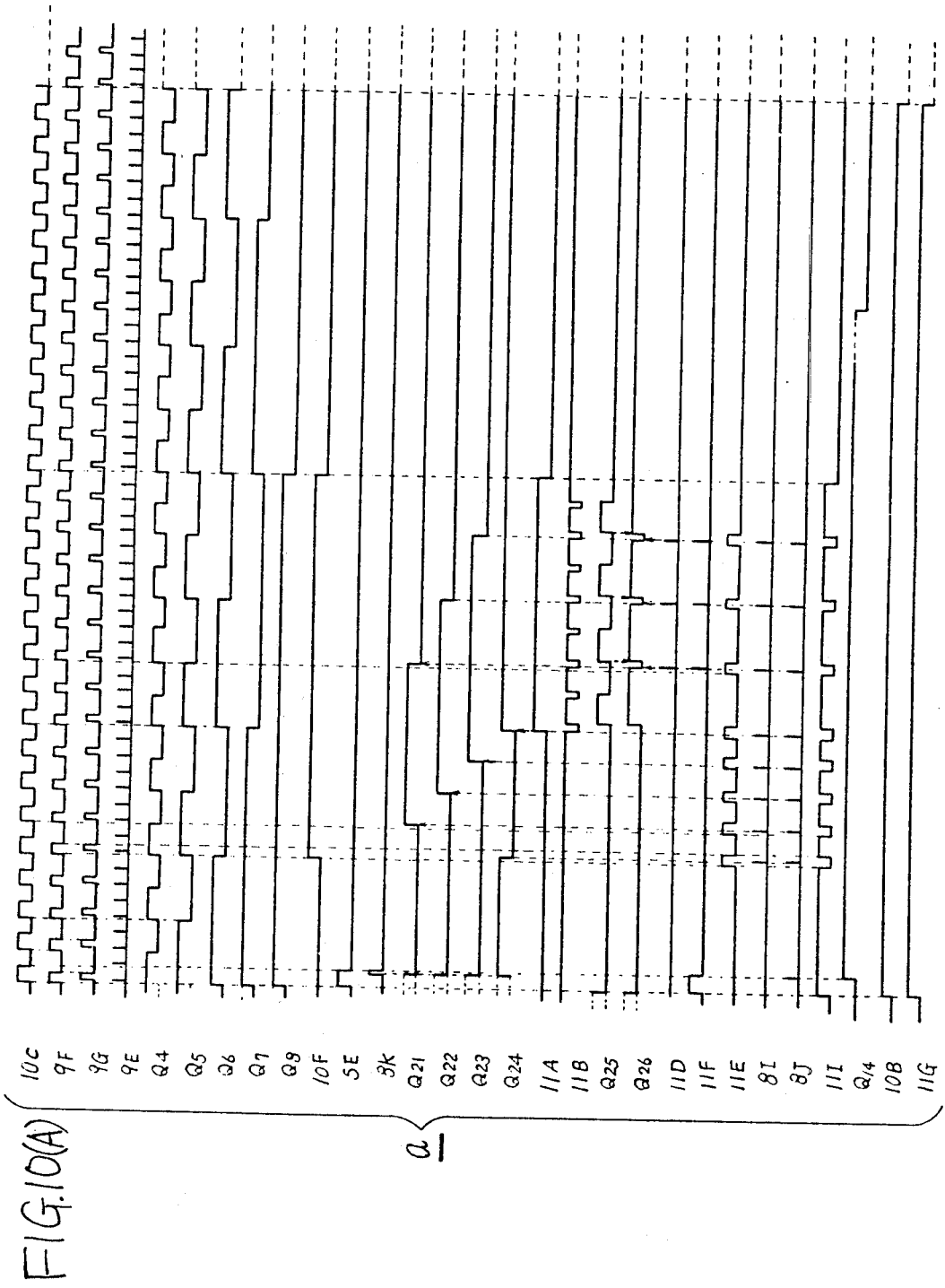

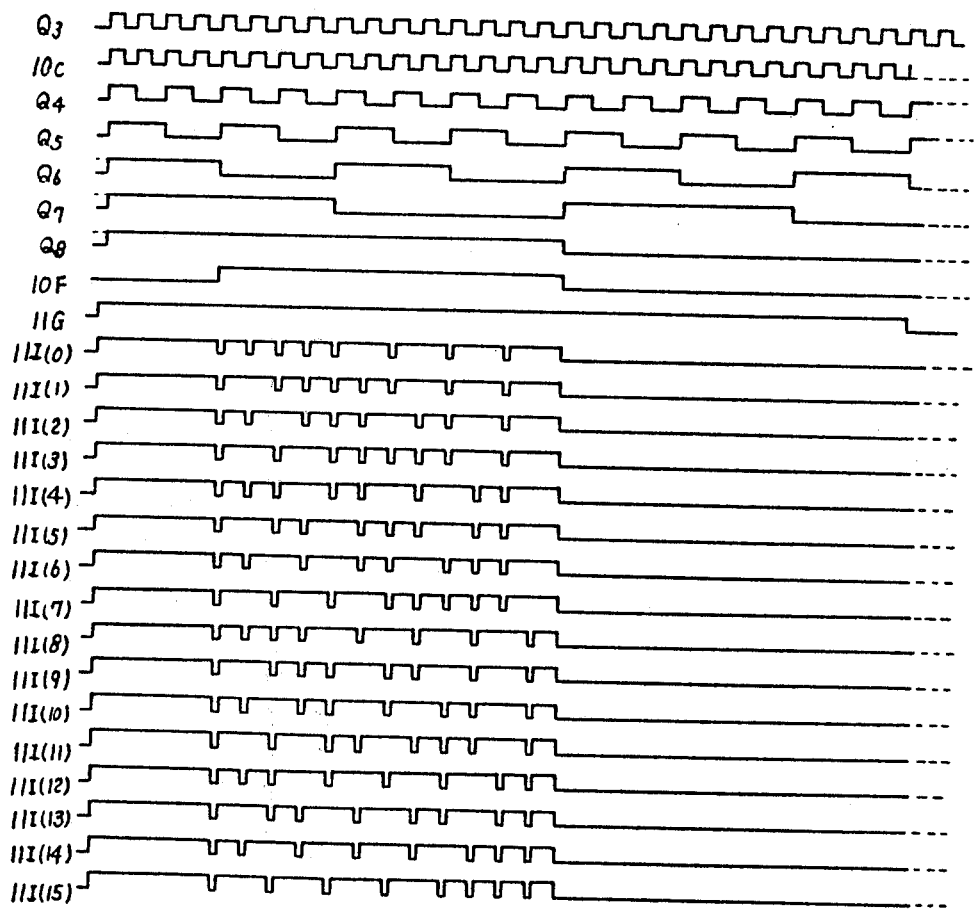

SIGNAL GENERATOR FOR PRODUCING PULSE SIGNALS FOR A REMOTE CONTROL

BACKGROUND OF THE INVENTION

1. Field of the Invention

The present invention relates to a signal generator for producing a specially coded signal for transmitting information with a high reliability. The signal generator is suitable for use, for example, in the remote control of an apparatus by means of light or supersonic wave.

2. Background

Kazumi KAWASHIMA, one of the inventors of the present invention developed a signal generator for producing a pulse signal for the remote control of an electric apparatus such as the channel selector and sound volume controller of a television receiver. That prior signal generator was disclosed in the U.S. Pat. No. 3,845,473. A problem associated with that signal generator is that when channels of a large channel number are included within its designed capability, the circuit configuration becomes very complicated.

SUMMARY OF THE INVENTION

The present invention provides a signal generator for producing a specially coded signal for transmitting information with a high reliability, while having a more simple circuit configuration.

BRIEF EXPLANATION OF THE DRAWING

FIGS. 4(A) and 4(B) together constitute a single circuit diagram FIG. 4(A)—(B).

FIG. 4(C) is a reduced version of FIG. 4(A) and FIG. (4)(B), to show how FIG. 4(A) and FIG. (B) are coupled to one another to constitute the one diagram FIG. 4(A)-(B).

FIG. 5 to FIG. 11 are timing diagrams showing various internal and output signals of the circuits of FIG. 4(A)-(B).

FIG. 5 is a timing diagram of various internal and output signals of the circuit of FIG. 4(A)-(B).

FIG. 6(A) to FIG. 6(D) are timing diagrams of internal and output signals of the circuits of FIG. 4(A)-4(B) illustrating the operation of various element switches.

FIG. 7 is a timing diagram of various internal and output signals of the circuits of FIG. 4(A)-(B) illustrating the case in which more than one switch is operated almost at the same time.

FIG. 8(A) and FIG. 8(B) are timing diagrams internal and output signals of the circuits of FIG. 4(A)-4(B) illustrating the case in which switches produce chattering pulses.

FIG. 9(A) to FIG. 9(C) are timing diagrams various internal and output signals of the circuits of FIG. 4(A-)-(B) illustrating operations with various kinds of input signals, FIG. 9(C) being the continuing part of the timing diagram of FIG. 9(B), and FIG. 9(C) being a continuation to the right of FIG. 9(B).

FIG. 10(A) and FIG. 10 (B) are timing diagrams of various internal and output signals of the circuit of FIG. 4(A)-(B) illustrating operations of switches 2-0 and 2-1 of a key 2, in FIG. 4(C) respectively.

FIG. 11 is a timing diagram of various internal and output signals of the circuit of FIG. 4(A)-(B) illustrating the operations of various element switches of the key 2.

DESCRIPTION OF THE PREFERRED EMBODIMENT

Figure 2:
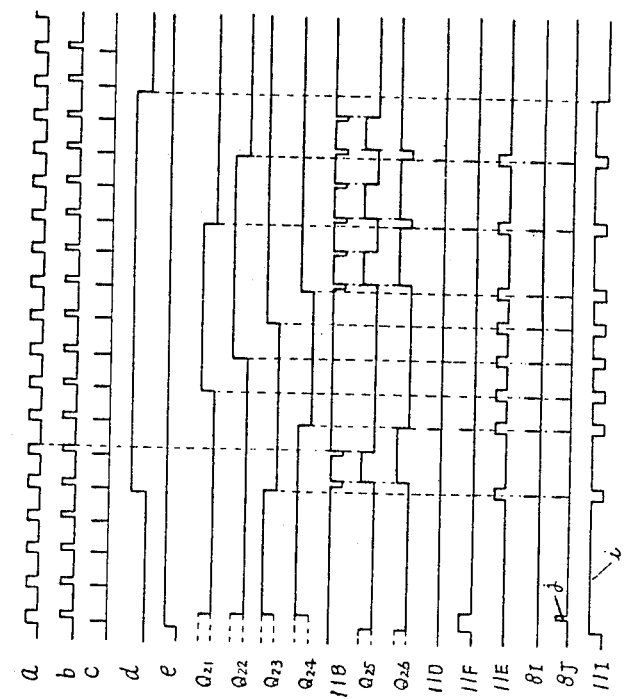
FIG. 2 is a timing diagram of various internal and output signals of the circuit of FIG. 1.

The signal generator of the present invention is characterized by comprising:

a shift register into which an input signal including a preset number of bits is coupled to produce a serial output signal at an output terminal thereof, a means for feeding another serial signal which is inverse to said serial output signal to an input terminal of a first stage of the shift register, and an output pulse generator which generates output pulses of broader and narrower widths responsive to the output signals of the shift register.

In the preferred embodiment, the input signal to shift register 8 is provided by an operation of, for example, a switch keyboard in a memory in a binary system and is memorized once in the shift register. The output of the shift register is coupled to a pulse width modulation circuit, and after every output for one bit, an inverse pulse to the output of the shift register is coupled to an input terminal of the first stage of the shift register. Thus, the output pulse train of the shift register comprises a first group pulses and a subsequent, latter or second group of pulses, the latter or second group having an opposite relation between broader pulses and narrower pulses to that of the first part. Therefore, the total length of the time period for the pulse train consisting of the first group of pulses and the second group of pulses becoming constant independent of the contents of coding. By such a characteristic of the constant time period length for one signal, it becomes easier to detect a false or a spurious signal caused by noise in a receiver side, thereby assuring a highly reliable signal transmission.

The present invention is now described by means of a preferred example referring to the drawings.

Figure 1:
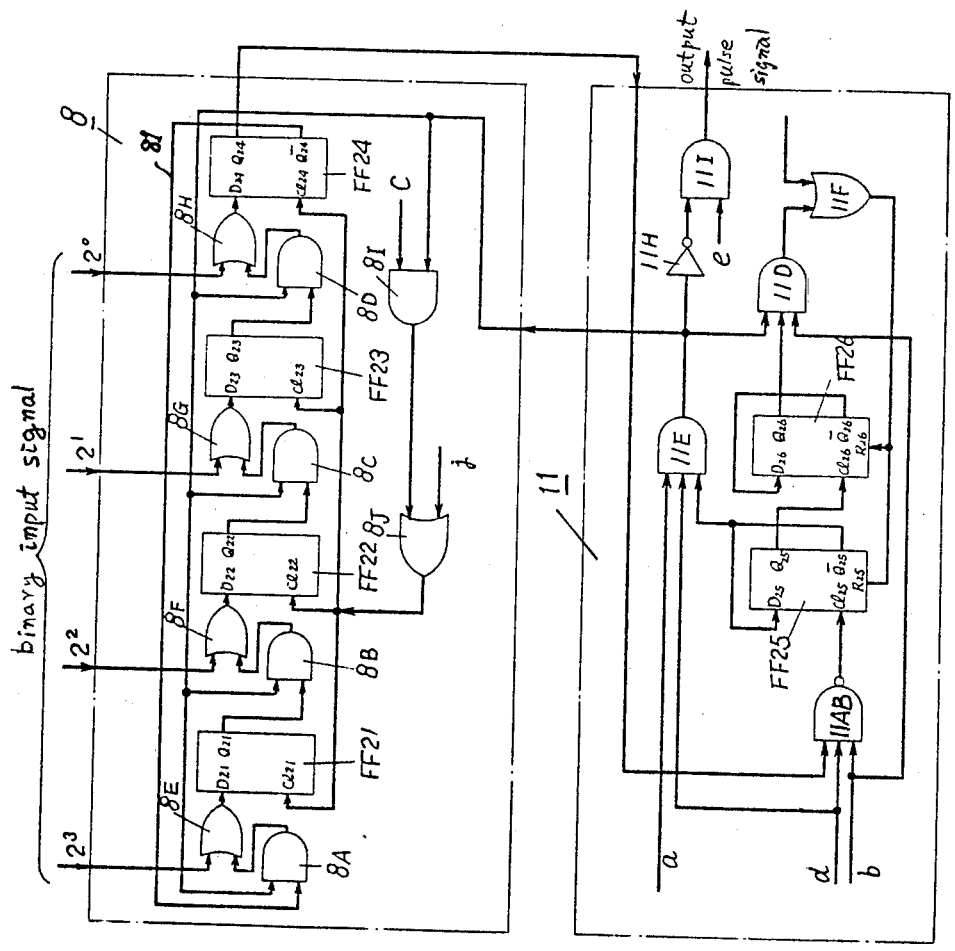
FIG. 1 is a circuit diagram of the preferred embodiment of a signal generator according to the present invention.

FIG. 1 is a circuit diagram of a preferred example of the signal generator according to the present invention. In FIG. 1, reference numeral 8 designates a 4-bit shift register, and reference numeral 11 designates an output pulse generator coupled to the shift register 8. Shift register 8 consists of four D-type flip-flops FF 21, FF 22, FF 23 and FF 24, five AND-gates 8A, 8B, 8C, 8D and 8I and five OR-gates 8E, 8F, 8G, 8H and 8J. The OR-gates 8E, 8F, 8G and 8H are connected by their output terminals to input terminals D21, D22, D23 and D24 of the flip-flops FF 21, FF 22, FF 23 and FF 24, respectively. The AND-gates 8A, 8B, 8C and 8D are connected by their output terminals to input terminals of the OR-gates 8E, 8F, 8G and 8H, respectively. The output terminal Q24 of the last stage flip-flop FF24 is connected to one input of a gate 11 B in output pulse generating circuit 11. A feed back connection 81 for feeding back an opposite polarity signal to that of the output at the output terminal Q24 is connected between the other output terminal Q24 of flip-flop FF 24 and an input terminal of the AND-gate 8A of the first stage flip-flop FF 21. Binary type input signals are coupled through the OR-gates 8E, 8F, 8G and 8H to the flip-flops FF 21, FF 22, FF 23 and FF 24, respectively. Provided that, the input signals are provided after such conversion that the figure of the highest digit is inverted and then the inverted figure is displaced to make the lowest digit. For example, if a binary signal of "0 0 0 1" is intended to be produced by this signal generator, then a converted signal of "0 0 0 1" is coupled to shift register 8 as its input signals. Such conversion can be made by a known circuit construction. Shifting pulses c and latching pulses j for shift register 8 are coupled through the AND gate 8I and the OR gate 8J, respectively. To the AND-gate 8I, output pulses from an AND-gate 11E of the output pulse generator 11 is given, too.

Output pulse generator 11 comprises a two-stage counter formed by a cascade connection of two flip-flop circuits FF 25 and FF 26, NAND-gate 11AB, AND-gates 11D, 11E and 11I and OR-gate 11F. The AND-gate 11E receives fundamental pulse "a", output time determining signal "d" and the output signal of the output terminal $\overline{Q25}$ of flip-flop FF25, and issues output pulses shown by 11E of FIG. 2. The NAND-gate 11AB receives output signal of the output terminal Q24 of the shift register 8, clock pulses "b" and the output time determining signal "d", and gives pulses for clock function to the flip-flops FF 25 and the output of output terminal Q25 of flip-flop FF25 is fed to flip-flop FF26 as a clock pulse only during the time period while shift register 8 is issuing its output "1". The AND-gate 11D receives the output signal of the AND-gate 11E, the output signal of the output terminal Q26 and the clock pulses "b", and issues reset pulse to the flip-flops FF 25 and FF 26 through the OR-gate 11F upon issue of two output pulses from the AND-gate 11E after the counter constituted by flip-flops FF 25 and FF 26 counts two output pulses of the NAND-gate 11AB.

Now, operation to issue an output pulse corresponding to a binary signal "0 0 0 1" is elucidated hereafter referring to the timing diagrams of FIG. 2.

At first, the signal "0 0 0 1" is converted through means not shown to "0 0 1 1", and the converted "0 0 1 1" signal is coupled to gates 8E, 8F, 8G and 8H to shift register 8. Then by impressing latch pulse "j" in the wave form j of FIG. 2 to the gate 8J and shift pulse c shown in FIG., 2 together with output pulse of the gate 11E to the gate 8I, the flip-flops FF 21 to FF 24 are clocked so as to memorize the input signals. The output signals at the output terminals Q21, Q22, Q23 and Q24 of the flip-Flops FF 21, FF 22, FF 23 and FF 24 are shown in FIG. 2 by the same marks. The gate 11D receives the output gate 11E and the output from output terminal Q26 of the flip-flop FF26 and causes the reset of flip-flop FF 25 and FF 26 when an output pulse is coupled through gate 11F after the counting of two output pulses from gate 11AB.

Then the output time determining signal "d" is impressed onto gate 11E, and a first pulse appears at the output of gate 11E. Accordingly, gate 8I issues a shift pulse "c" whenever there is an enabling signal from gate 11E and couples it through gate 8J to the four flip-flops FF 21 to FF 24. At the same time, gates 8A to 8D become ON, and therefore, the shift register shifts one bit and the last stage flip-flop FF 24 provides the inverted output signal from its output terminal $\overline{Q24}$ to the input terminal Q21. Therefore, the status of shift register 8 represents the state of "0 0 0 1", and flip-flop FF 24 produces an output corresponding to the first bit to the gate 11AB. Thus, gate 11AB provides clock pulses "b" of FIG. 2, and flip-flops FF 25 and FF 26 count those clock pulses and provide the pulses of Q25 and Q26 of FIG. 2. During the duty time of the pulses of Q25 and Q26, by means of the inverted output signals from the output terminal $\overline{Q25}$ of the flip-flop 25, the gate 11E is turned OFF. Therefore, the fundamental pulse "a" is not transmitted. Namely, the output pulses of the AND-gate 11E are omitted for one bit.

Upon the arrival of the next and subsequent pulses of the fundamental pulses "a", the output of the terminal $\overline{Q25}$ of the flip-flop FF25 returns to [H] (logic level high) level, and therefore, gate 11E restores to provide an output pulse. Upon receipt of the output pulse of the gate 11E, the gate 11D provides a reset pulse to reset the flip-flops FF 25 and FF 26.

Then, as a result of the output pulse from gate 11E, like the abovementioned, gate 8I of the shift register 8 provides a shift pulse, and hence shift register 8 provides the output "L" (logic level low) of the second bit of the binary signal. As a result, the signal from the terminal Q24 coupled to gate 11AB becomes "L", thereby retaining the output of the terminal $\overline{Q25}$ to [H] level. Therefore, the gate 11E passes a next pulse of the fundamental pulse "a" as an output pulse of the output pulse generator 11.

By means of the abovementioned way, the output signal of the output pulse generator is provided from the gate 11E in such a manner that time interval between the neighboring two pulses is controlled to be broader for the input signal of "H" and narrower for the input signal of "L", and that the shift register 8 shifts one stage for each of the output pulses.

Further, when the contents of the binary signal finished a passing through of the shift register upon issue of fourth shift pulse, by means of another pulse train of inverted polarity to that of the binary signal fed through the connection 81 to the input terminal D21, similar operation to the above is carried out, for such a binary signal that "H" and "L" of each bit of the former binary signal is inverted to each other. As a result, a second pulse train having opposite relation of pulse intervals to that of the former pulse train is issued from the output terminal of the AND-gate 11E.

In this way, a pulse width modulation is obtainable by using the output signal of the output pulse generator 8 in such a way that pulse widths are controlled responding to the input binary signal and that the pulse train has a first group and a subsequent second group, wherein relation of arrangement of the narrower pulses and the broader pulses is opposite to that in the first group.

The output of the AND-gate 11E is the pulse train wherein the pulse intervals are controlled responsive to the input binary signal, and therefore, by inverting the polarity of the output signal of the AND-gate 11E by means of the inverter 11H, and by gating the inverted output signal of the inverter 11H by a gate 11I utilizing a gate pulse "e" the leading edge of which occurs a little before the leading edge of the output time determining signal "d" and the trailing edge of which occurs a little after trailing edge down of the same, it is possible to obtain a pulse train shown by the wave form of 11I of FIG. 2 which comprises a leading group, broader pulses and narrower pulses wherein pulse widths are controlled responsive to input binary signals. The output pulse train 11I generated by the example of FIG. 1 circuit consists of 8 bits of pulses.

As is apparent from the foregoing explanation, the output pulse train generated by utilizing the apparatus of the present invention has a feature that the first half part (first group) and the latter half part (second group) are opposite with each other with respect to the relation of the broader width pulses and narrower width pulses. Therefore, it is possible in the receiver that by decoding the arrangement of the broader pulses and the narrower pulses and by comparing the relation of the first group and the latter part, a spurious signal, for example, affected by noise, can be easily detected, thereby drastically increasing reliability of the transmission of the signal.

Since the first group and the latter group have an opposite relation with respect to pulse width, there exists a sequence of the generated output pulse train (consisting of 8 bits in this example) which has the same specified numbers (four in this example) of broader pulses and narrower pulses. Therefore, by presetting the number of pulses of the first part—(the pulse number is dependent on the number of stages of the flip-flops in the shift register)—it is possible to make the total time period of a sequence of the generated output pulse train constant and independent of the contents of the input binary signal. Therefore, it is possible to carry out transmitting gating in the transmitter side or receiving gating in the receiver side with a gate utilizing constant width gate pulses, thereby simplifying the circuit construction.

Such pulse generating apparatus is most suitable when applied to transmitters of various data transmission system or remote controlling system.

Figure 3:
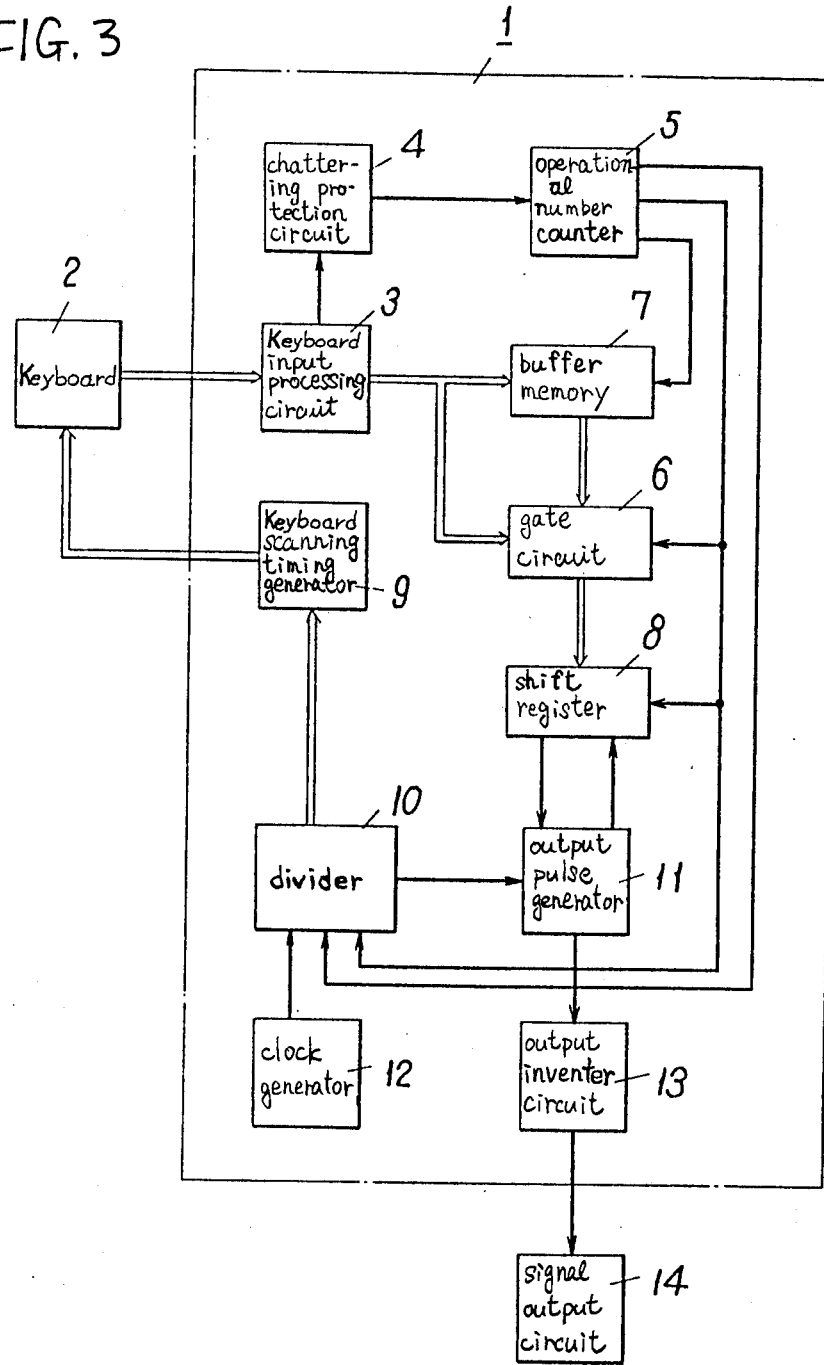
FIG. 3 is a block diagram of a signal transmitter utilizing the signal generator shown by the circuit of FIG. 1.

A transmission apparatus for remote control using the signal generator of the present invention in FIG. 1 is described by referring to FIG. 3—FIG. 11. FIG. 3 shows a block diagram of the transmission apparatus for remote control. FIGS. 4(A)-(B) and 4(C) show detailed circuit diagrams of the transmission apparatus. FIG. 5, FIGS. 6(A), 6(B), 6(C) and 6(D), FIG. 7, FIGS. 8(A) and 8(B), FIGS. 9(A) and 9(B)-(C), FIGS. 10(A) and 10(B), and FIG. 11 are timing diagrams of signals at various parts and outputs of the transmission apparatus.

In FIG. 3, a block 1 designates a part constituted by a single IC (integrated circuit) chip. A keyboard 2 having a plurality of switches for activating for remote control is attached to the block 1. A keyboard input processing circuit 3 determines which signal of the keyboard input is priority processed when more than two switches of keyboard 2 are turned on at the same time, and it generates a specified and binary coded signal responding to a selected element switch. A chattering protection circuit 4 removes an effect of the chattering by the switches of the keyboard 2. An operational number counter 5 counts a precise operational detection output which is generated from the chattering protection circuit 4 when the keyboard 2 is operated. When the keyboard 2 is operated twice or less within a specified preset period, the operational number counter 5 continuously generates respective output signal(s) responding to input signal(s) at the first operation and the second operation of the keyboard 2, and it further generates an output inhibiting signal when the keyboard is operated for another operation (more than thrice) within the same specified preset period.

An instruction signal(s), which is (are) generated by the operation of the keyboard 2 is coupled to shift register 8 by a gate circuit 6 in accordance with the sequential order of the first operation and the second operation. A buffer memory 7 temporarily stores the instruction signal provided by the second operation of the keyboard 2. A frequency divider 10 generates fundamental signals for the several circuits including an output pulse generator 11 by dividing clock pulses from a clock generator 12. An output inverter circuit 13 inverts logic levels of output signals of the output pulse generator 11.

The shift register 8 and the output pulse generator 11 are the same as previously discussed with reference to FIG. 1 and FIG. 2. The block 1 comprising several circuits 3, . . . , 13 generates output signals of a pulse train modulated in the width thereof in accordance with the instruction signal fed by the keyboard switch 2. A signal output circuit (or a transducer) 14 modulates a carrier signal of an ultrasonic wave, light, etc. by use of the output signals from the block 1, and it transmits the modulated carrier signal as a signal to be used for the remote control.

Figure 4A:
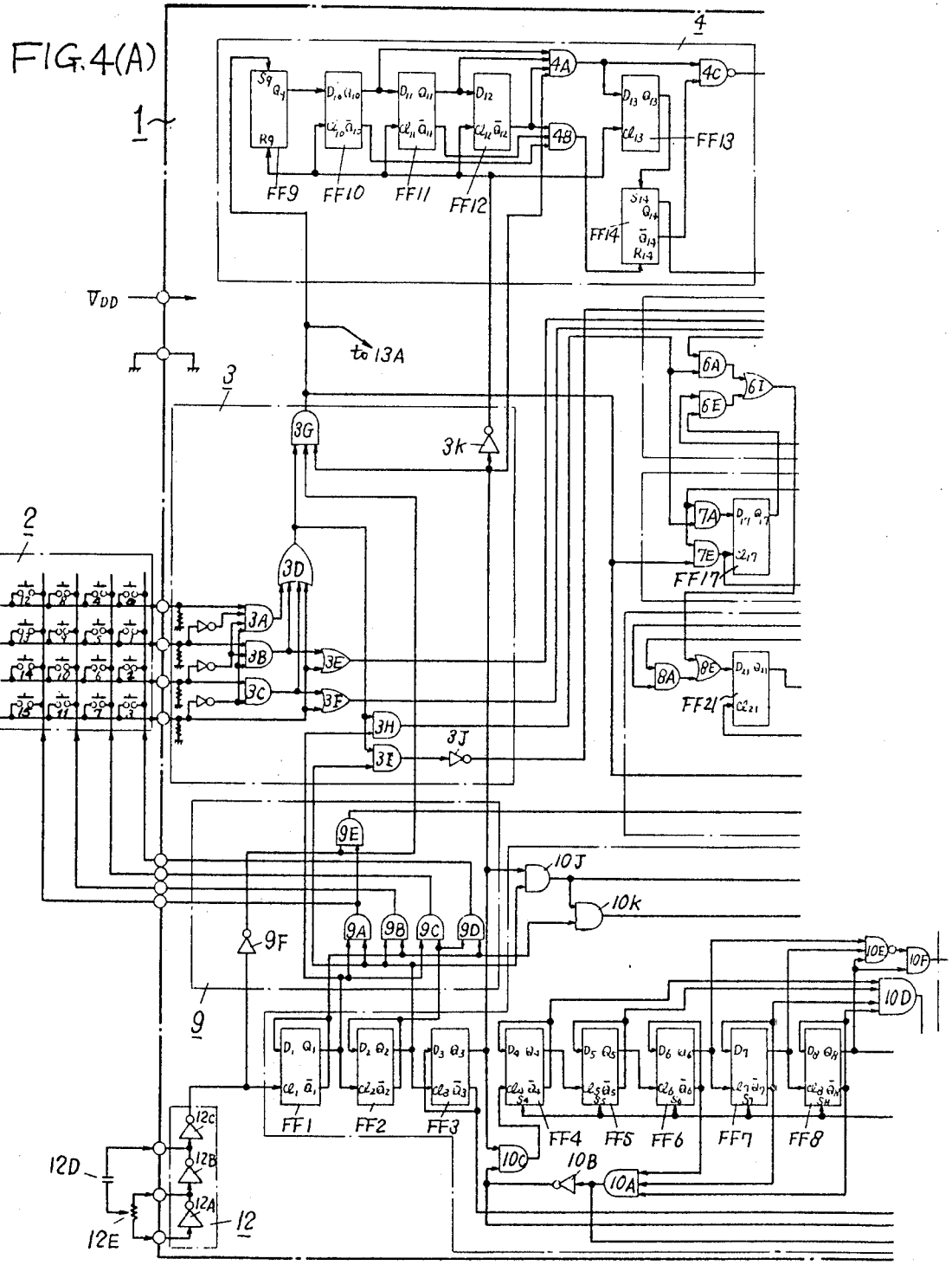
FIG. 4(A) and FIG. 4(B) are a left part and a right part respectively of detailed circuit diagram of the signal transmitter shown in block diagram in FIG. 3.
Figure 4B:
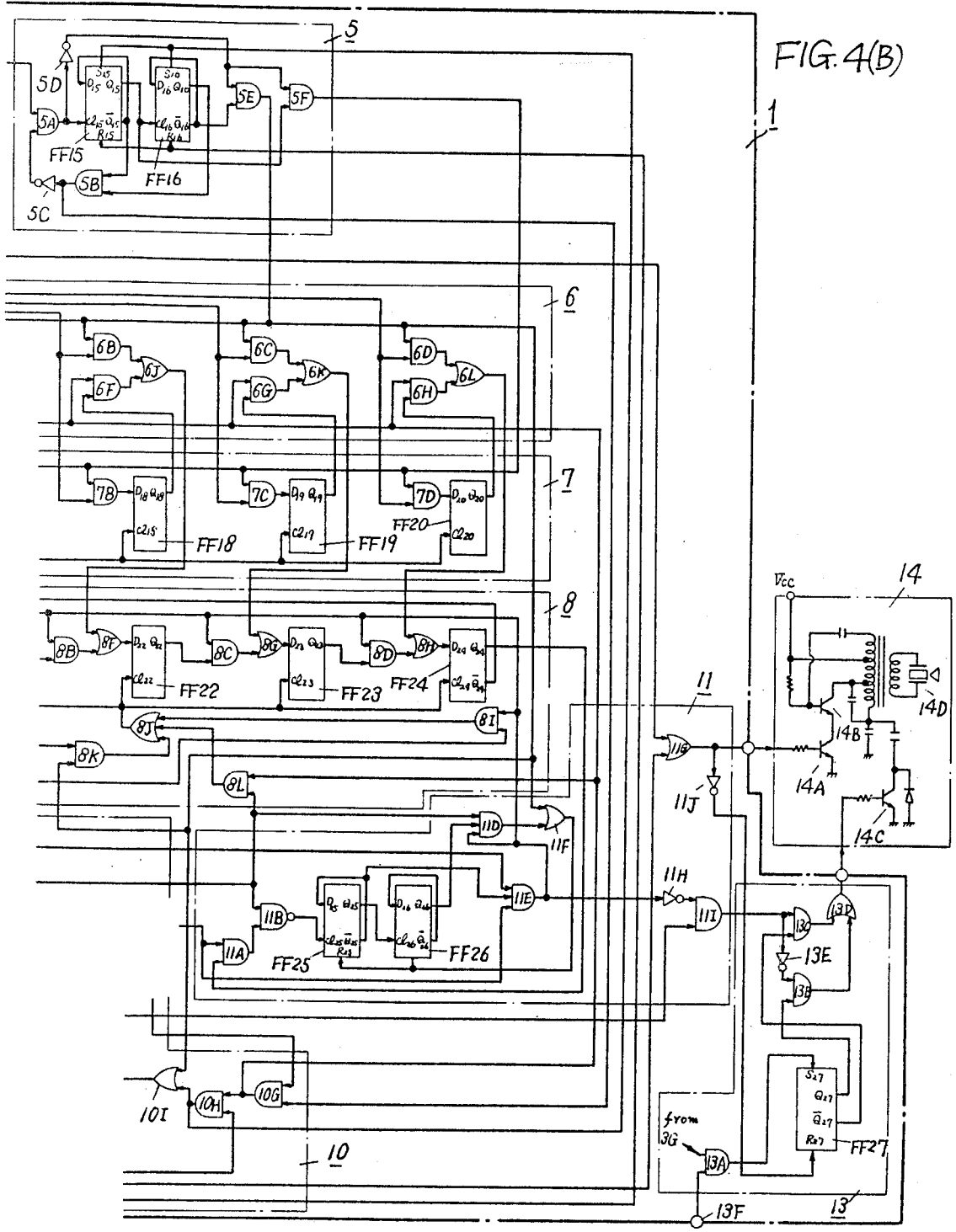

The operational function of the transmission apparatus is described in detail by referring to its whole circuit diagram shown in FIGS. 4(A)-(B) and 4(C), and to timing charts shown in FIG. 5, FIGS. 6(A), 6(B), 6(C) and 6(D), FIG. 7, FIGS. 8(A) and 8(B), FIGS. 9(A) and 9(B)-(C), FIGS. 10(A) and 10(B), and FIG. 11. In the timing diagrams, numerals designate to terminals of the devices or the devices per se. The AND-gate 11A and NAND-gate 11AB in FIG. 4 constitute the NAND-gate 11AB in FIG. 1.

Figure 5:
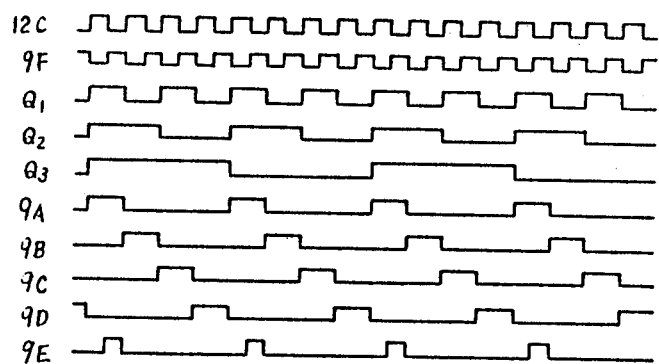

The clock generator 12 is constituted by three inverters 12A, . . . , 12C, a capacitor 12D and a resistor 12E which determine the frequency of the clock pulses. We assume here it is 0.8 KHz (period: 1.25 msec.). The divider 10 is constituted mainly by eight D-type flip-flops FF1, . . . , FF8. By using divided output pulses Q1, . . . , Q3 of the first three stages of the eight-stage divider 10, keyboard scanning timing pulses for row element switches of the keyboard 2 are made by gates 9A, . . . , 9D at output terminals of the gates 9A, . . . , 9D, respectively, successively change their logic levels one after another as shown in FIG. 5. They are applied to respective column switches of the matrix arrangement in the keyboard 2. Output pulses of row switches of the key 2 are coupled to the keyboard input processing circuit 3.

Gates 3A, . . . , 3C are used to preferentially transfer a pulse from the most lowest row switches among an arbitrary number of the switches. This priority function is so designed that a pulse from the switches of most lowest row is preferentially taken out when more than two switches in an identical column are turned on at the same time. The pulse from the keyboard and output pulses of the flip-flops FF 1 and FF 2 are processed logically by gates 3D, . . . , 3F, 3H and 3I and an inverter 3J.

Figure 6B:
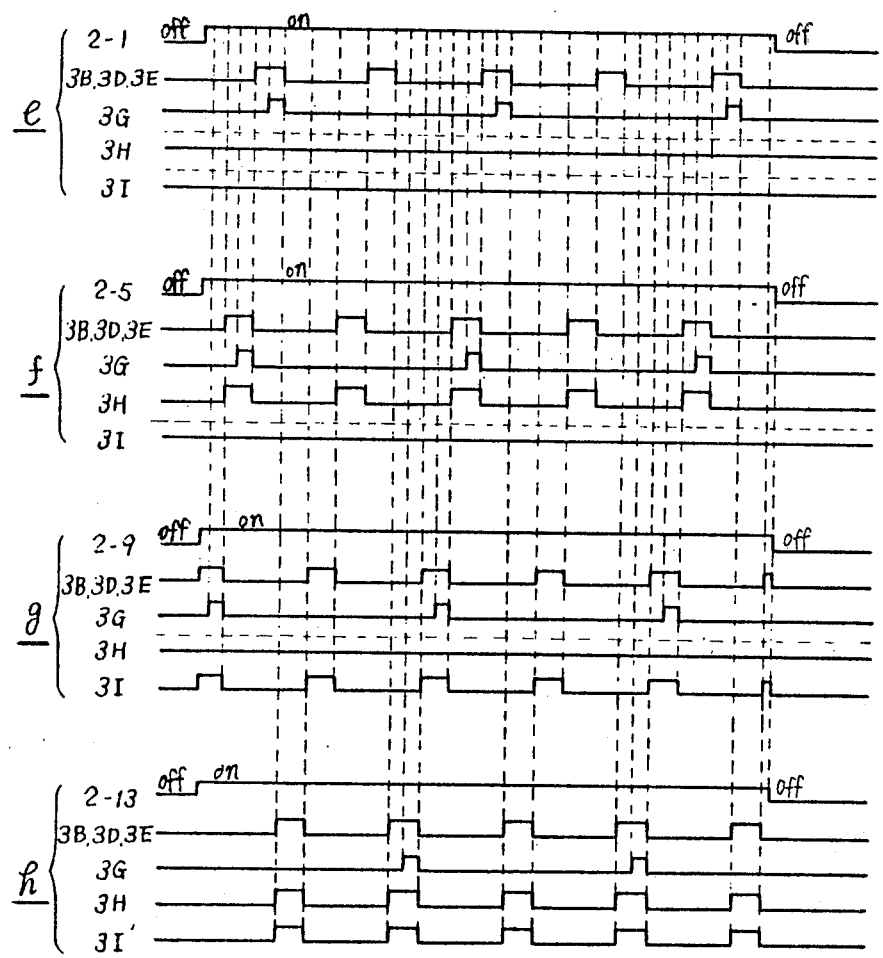
Figure 6C:
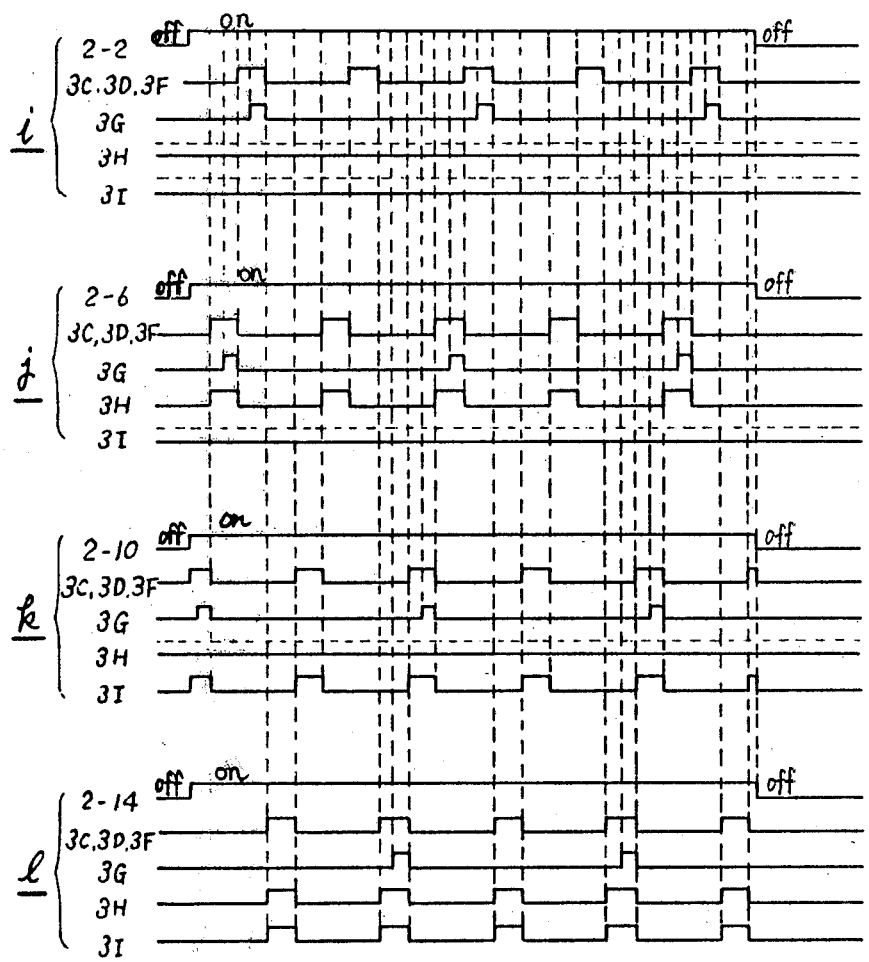
Figure 6D:
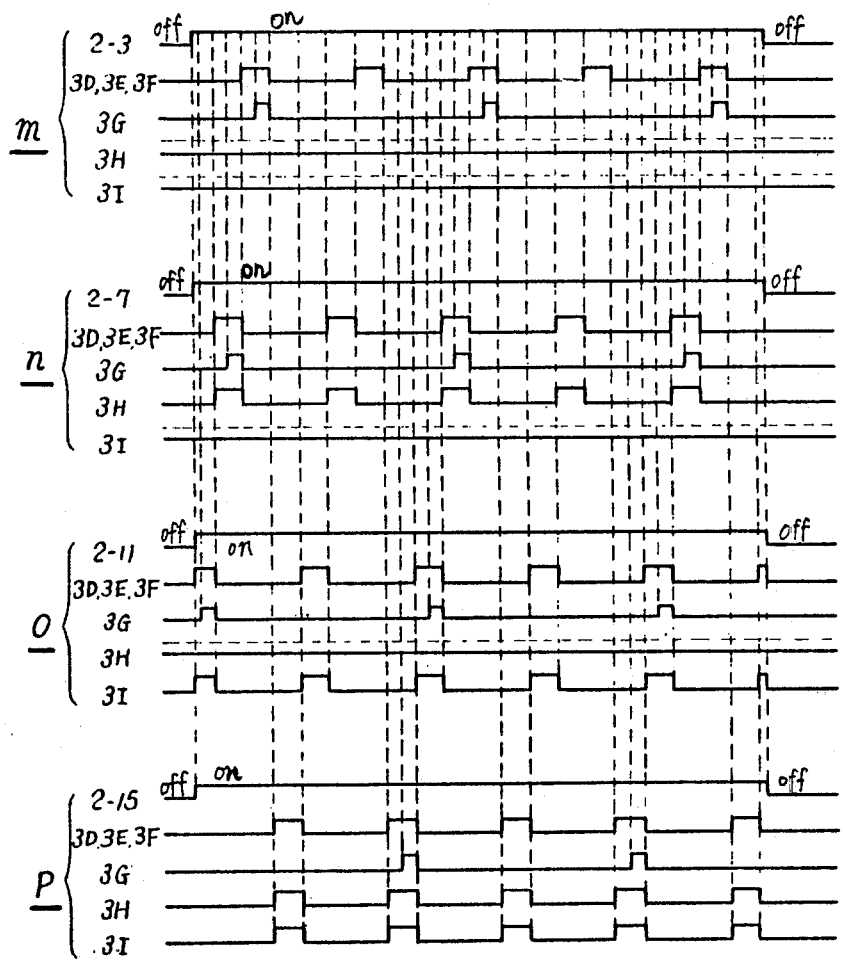

Resultant pulses 3G, . . . , 3I are used as instruction signals in accordance with the turn-on and turn-off operations of the element switches 2-0, . . . , 2-15 as shown in FIG. 6(A), . . . , FIG. 6(D), where a timing chart in a group a is for the switch 2-0, etc. In FIG. 6(A), groups a, b, c and d respectively correspond to the switches 2-0, 2-4, 2-8 and 2-12. When one switch among the switches 2-0, 2-4, 2-8 and 2-12 is turned on, output levels of the gates 3B, 3C, 3E and 3F are "L". In FIG. 6(B), groups e, f, g and h corrrespond to the switches 2-1, 2-5, 2-9 and 2-13. When one switch among the switches 2-1, 2-5, 2-9 and 2-13 is turned on, output levels of the gates 3A, 3C and 3F are "L". In FIG. 6(C), groups i, j, k and l correspond to the switches 2-2, 2-6, 2-10 and 2-14. When any one switch of the element switches 2-2, 2-6, 2-10 and 2-14 is turned on, output levels of the gates 3A, 3B and 3E are "L". In FIG. 6(D), groups m, n, o and p represent the operation by the switches 2-3, 2-7, 2-11 and 2-15. When any one switch element among switch elements 2-3, 2-7, 2-11 and 2-15 is turned on, output levels of the gates 3A, 3B and 3C are "L".

Figure 7:
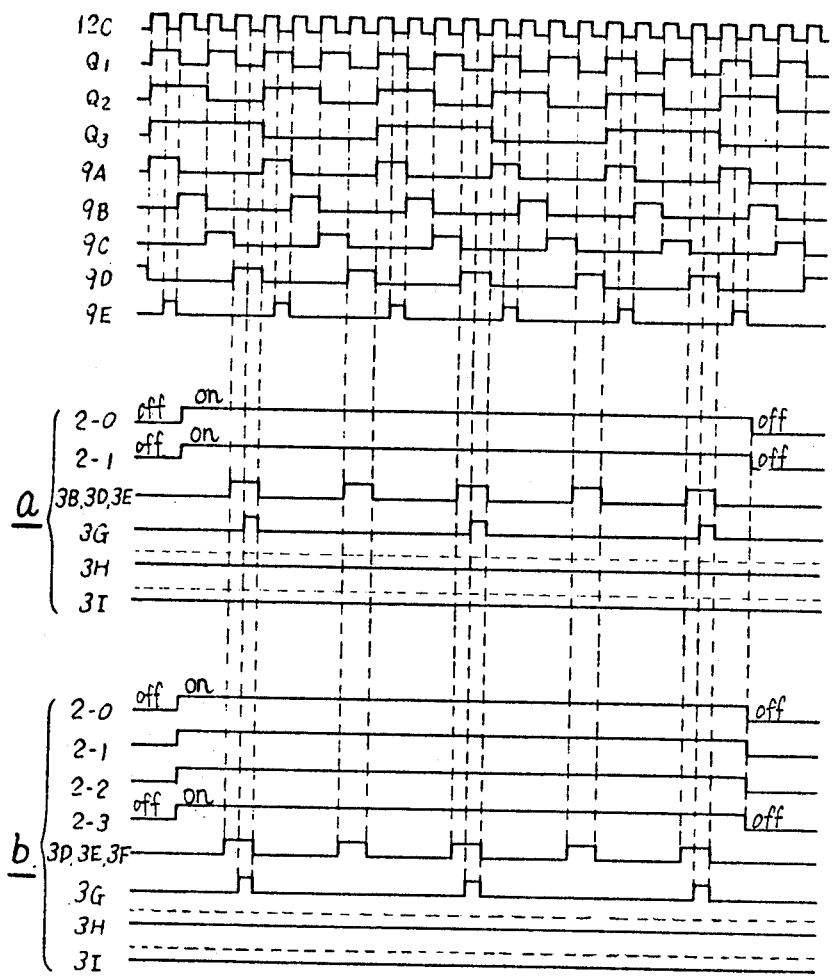

FIG. 7 shows two example cases where more than two switches in an identical column are turned on at the same time. A group a represents the case where two switches 2-0 and 2-1 are turned on at the same time (the output levels of the gates 3A, 3C and 3F are "L"). A group b represents the case where four switches 2-0, 2-1, 2-2 and 2-3 are turned on at the same time (the output levels of the gates 3A, 3B and 3C are "L"). It is clear in these cases that the resultant output levels represent the operation of the switch (2-1 or 2-3) in the most lowest row of the same column. The abovementioned priority function similarly applies to switches in other columns.

When two or more switches in an identical row of the key 2 are turned on, a priority function is established such that a pulse signal from an switch in the most leftward column is selected. This is because the key scanning timing pulses are successively supplied to the element elements from the leftward column to the rightward one and because the chattering protection circuit 4 detects the signal levels in accordance with the time sequence order.

Accordingly, when more than two switches are turned on at the same time, a priority function is established such than an element switch in the lowest row is favored and further an element switch in the a most leftward column is favored. This makes the operation of the switches free from errors.

The chattering protection circuit 4 is constituted by a four-stage flip-flop (an R-S flip-flop FF 9 and three D-type flip flops FF 10, . . . , FF 12), gates 4A and 4B, flip-flops FF 13 and FF 14, and a gate 4C.

Even though the turn-on and turn-off operations of the switches accompany chattering, simple-shaped single-pulses are generated from the gate 4C and the flip-flop 14, respectively, for one switching operation of the switches 2-0, . . . , 2-15.

In FIG. 8(A), a group a represents the case where either one of the element switches 2-0, 2-1, 2-2 and 2-3 is operated accompanying chatterings, and a group b represents the case where either one of the element switches 2-4, 2-5, 2-6 and 2-7 is operated accompanying chatterings.

Figure 8B:
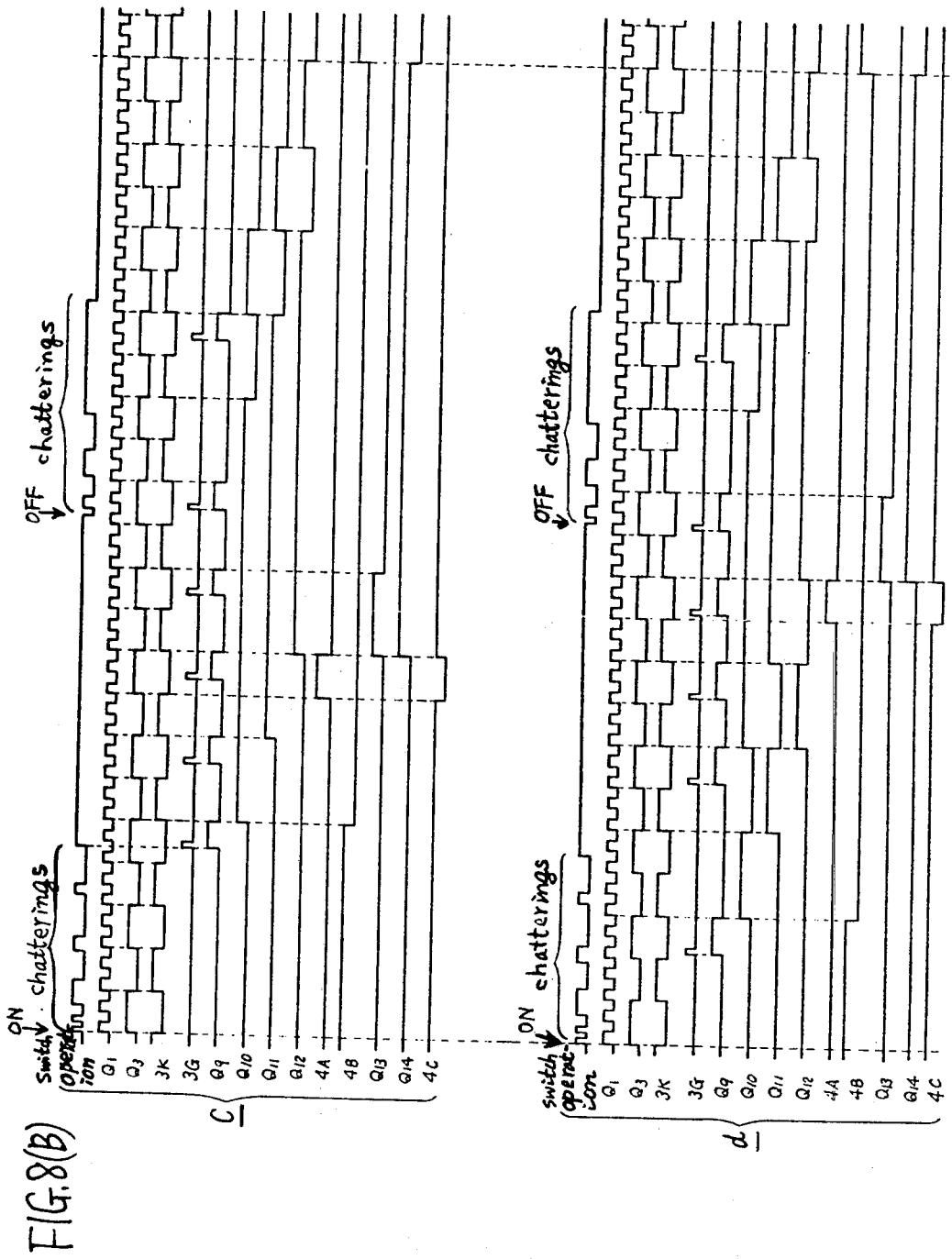

In FIG. 8(B), a group c represents the case where either one of the element switches 2-8, 2-9, 2-10 and 2-11 is operated accompanying chatterings, and a group d represents the case where either one of the element switches 2-12, 2-13, 2-14 and 2-15 is operated accompanying chattering.

The operational number counter 5 is constituted by flip-flops Ff 15 and FF 16, gates 5A, 5B, 5E and 5F, and inverters 5C and 5D. It detects an operational number (i.e., a number of times of operation) of the keyboard 2 within a specified preset time period (280 msec. for the present description) by an output signal of the divider 10 and an output signal of the chattering protection circuit 14. When one of the switches 2-0, . . . , 2-15 is operated only once within the specified preset time period, a single pulse 5E is generated from a gate 5E as shown in a diagram timing of a group a of FIG. 9(A). After one preset time period, the operational number counter 5 is set in another initial condition.

Figure 9C:
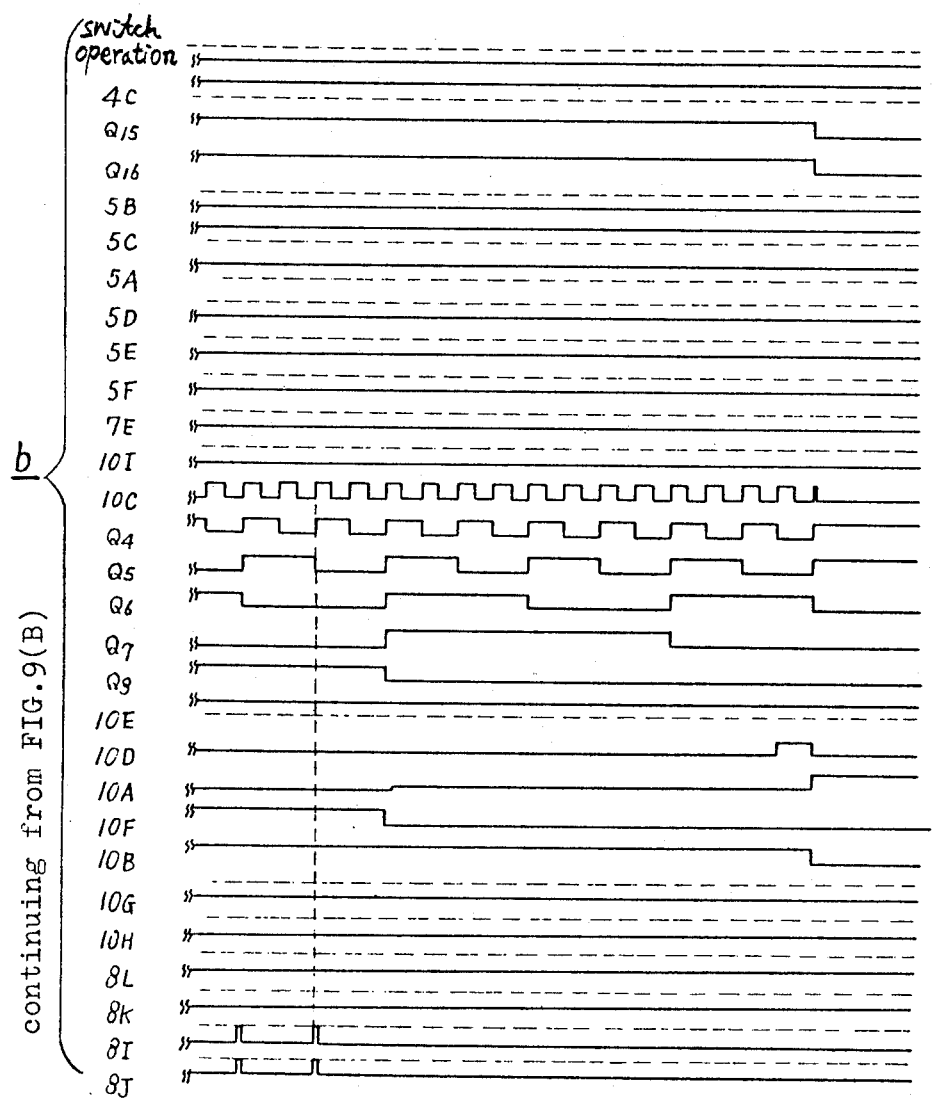

When more than two switches of the keyboard 2 are operated within one preset time period (280 msec.), logic levels at various terminals in the operational number counter 5 become the ones as shown in a timing chart of a group b of FIG. 9(B)–(C). An output pulse signal "5E" is generated from the gate 5E in the first switching operation of the element switches 2-0, . . . , 2-15, and an output pulse signal "5F" is generated from the gate 5F in the second switching operation of the element switches 2-0, . . . , 2-15. Since the gate 5A is cut off by an output pulse signal "5B" of the gate 5B, additional input signal pulses following first two pulses can not be put in the flip-flop FF 15 of the operational number counter 5 even if the element switches 2-0, . . . , 2-15 are operated more than twice within one preset time period.

When the instruction signals in accordance with the operations of the switches 2-0, . . . , 2-15 of the key 2 are put in the operational number counter 5, the instruction signal for the single operation of the switches 2-0, . . . , 2-15 and the first instruction signal for the plural number of operations of the switches 2-0, . . . , 2-15 are applied to the shift register 8, through gates 6A, . . . , 6D and 6I, . . . , 6L of the gate circuit 6, by a control by the output pulse signal of the gate 5E. The applied signal is simultaneously written in the flip-flops FF 21, . . . , FF 24 of the shift register 8 through gates 8E, . . . , 8H.

When the second operation is made by the element switches 2-0, . . . , 2-15 within one preset time period, the respective instruction signal is applied to flip-flops FF 17, . . . , FF 20 of the buffer memory 7, through gates 7A, . . . , 7D, by the output pulse signal of the gate 5F, and is written therein.

The shift register 8 and the output pulse generator 11 are similar ones as of FIG. 1. They are controlled principally by the instruction pulse signal coming from the gate circuit 6 and control pulses from the divider 10. A train of pulses modulated in their width comes out from a gate 11I in the similar manner with the function described above by referring to FIG. 1 and FIG. 2.

Figure 10B:
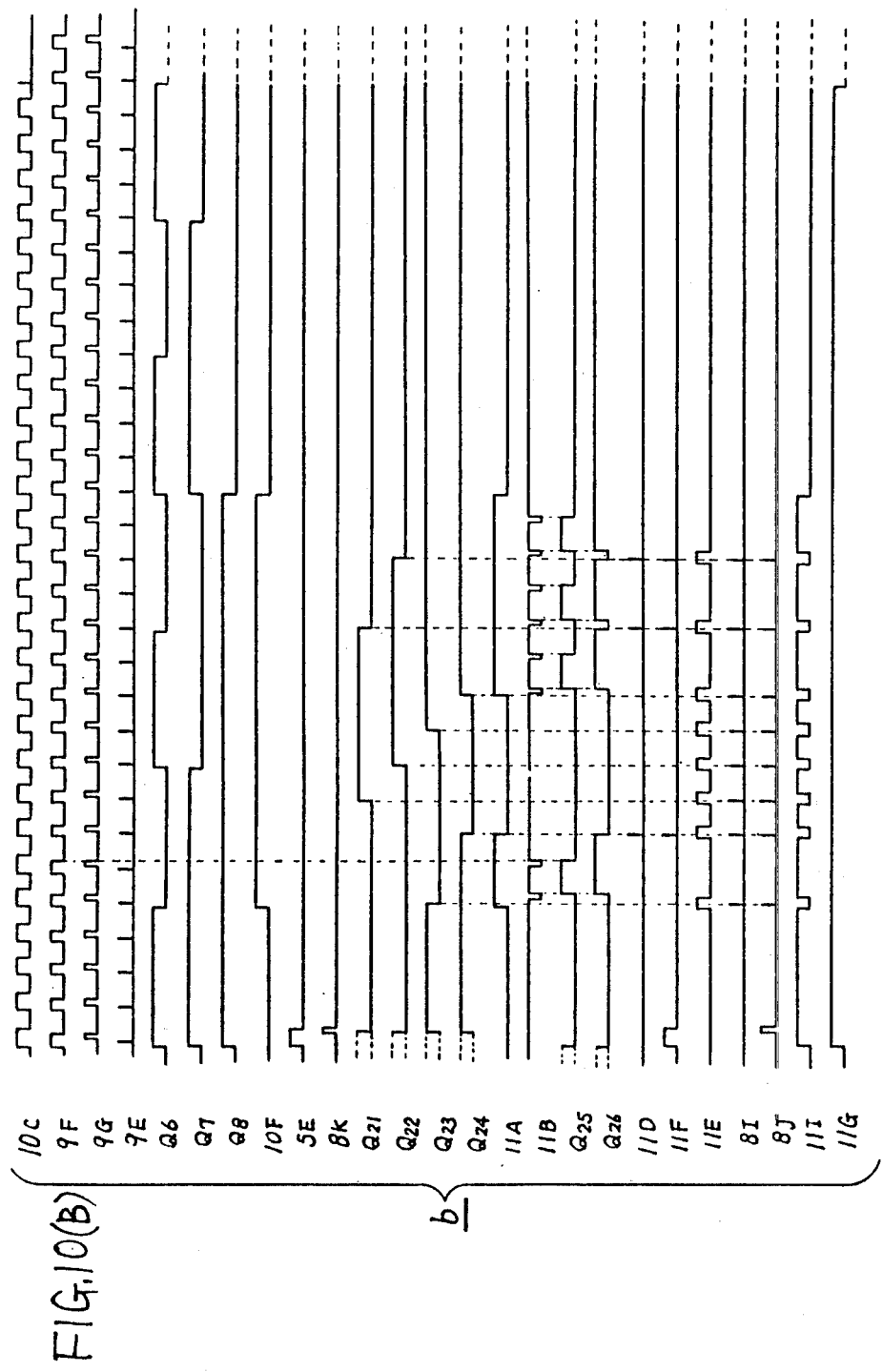

FIG. 10(A) shows a group a of a timing diagram representing the case where the switch 2-0 is operated. FIG. 10(B) shows a group b of a timing diagram representing the case where the switch 2-1 is operated. The operational function of the shift register 8 and the output pulse generator 11 of FIG. 4(A)–(B) and FIG. 4(C) is similar with those of FIG. 1, since only several controlling gates are added to the circuits of FIG. 1. Accordingly, no detailed discussion is given here.

Forms of the logic levels of the output pulse signals of the gate 11I of the output pulse generator 11 depend on which switch(es) of the keyboard 2 is (are) selectively operated. FIG. 11 shows several pulse trains 11I(0), . . . , 11I(15) of the output pulse signals of the gate 11I, which pulse trains 11I(O), . . . , 11I(15) correspond to the operations of the switches 2-0, . . . 2-15, respectively.

When the switches are operated twice within one preset time period, the output signal of the gate 11I is generated by the instruction pulse signal which is put in the shift register 8 by the first operation of the switches, and then the other instruction pulse signal, which was made by the second operation of the element switch and is stored in the buffer memory 7, is transferred to the shift register 8 through the gate circuit 6. The other output signal of the gate 11I modulated in the pulse width thereof is similarly generated as the case for the first operation of the switches, thereby generating collectively two trains of the output pulse signals to be used for remote control.

The output inverter circuit 13 is constituted by an R-S flip-flop FF 27, gates 13A, . . . , 13D and an inverter 13E. When a control signal at a control terminal 13F has a logic level of "L", the output pulse signal of the gate 11I in the output pulse generator 11 is fed out from the gate 13D through the gate 13C. On the contrary, when the control signal at the control terminal 13F has a logic level of "H", the output pulse signal of the gate 11I inverted by the inverter 13E is fed out from the gate 13D through the gate 13B. The output inverter circuit 13 is provided for the convenience that the output pulse signal from 11I can be applied for the signal output circuit 14 independent of the polarity of control function used in the signal output circuit 14. In the circuits shown in FIG. 4(A)-(B) and FIG. 4(C), non-inverted output pulse signals are generated from the gate 13D.

In the signal output circuit 14 of the present signal transmission apparatus, an ultrasonic oscillator is employed. When the output pulse signal is generated from the gate 11G of the output pulse generator 11, transistors 14A and 14B turn on, thereby causing an oscillation circuit of the signal output circuit 14 in an oscillation condition at a specified oscillation frequency. On the other hand, when the output pulse signal is generated from the gate 13D of the output inverter circuit 13, a transistor 14C turns on, thereby changing the oscillation frequency of the oscillation circuit in the signal output circuit. Ultrasonic signals modulated by these two different frequencies are sent out from an ultransonic transducer 14D as signals for remote control.

There is another possibilty that the ultrasonic oscillator in the signal output circuit 14 is substituted with a signal generator of light, for example, light emitting diode, etc. In addition, the present signal transmission apparatus can be used not only for wireless remote control but also for closed circuit remote control by use of a glass fiber or the like as a signal transmission guide means.

In summary, the present invention can provide a signal generator for producing a specially coded signal for transmitting remote control information with a high reliability and besides with a fairly simple circuit configuration.

What we claim is:
1. A signal generator comprising:
a shift register into which an input signal including a preset number of bits is coupled to produce a serial output signal at an output terminal thereof,
a means for feeding another serial signal which is inverse to said serial output signal to an input terminal of a first stage of said shift register, and
a pulse width modulation means for modulating a carrier with output signals from said output terminal.

2. A signal generator comprising:
a shift register of parallel input serial output type into input terminals of which an input signal including a preset number of bits is to be put to produce a serial output signal at an output terminal thereof,
a connection for feeding another serial signal which is of opposite polarity to said serial output signal to an input terminal of a first stage of said shift register, and
an output pulse generator which generates output pulses of broader and narrower widths responding to the output signals of said shift register.

3. A signal generator comprising:
shift register means having plural stages and parallel inputs, one coupled to each stage thereof, for receiving a multi-bit parallel input signal having a predetermined number of bits corresponding to the number of stages of said shift register and for providing a serial output signal at a first output thereof and an inverted serial output signal at a second output thereof;
means for coupling said inverted serial output signal to the first stage of said shift register; and
pulse width modulation means for providing an output signal having a pulse width modulated bits responsive to the serial output signal of said shift register means, whereby the output signal of said pulse width modulator is a multi-bit serial signal of fixed length having first and second groups of pulses, each group containing a number of pulses equal to the number of stages of said shift register means and parallel input bits, each bit of the second group corresponding to a bit of the first group and having a pulse width that is inversely proportional thereto.

* * * * *